United States Patent [19]
Hart et al.

[11] Patent Number: 6,005,759
[45] Date of Patent: Dec. 21, 1999

[54] METHOD AND SYSTEM FOR MONITORING AND CONTROLLING AN ELECTRICAL DISTRIBUTION NETWORK

[75] Inventors: David G. Hart, Raleigh; William L. Peterson, Cary; David Uy, Raleigh; W. Michael Egolf, Apex, all of N.C.

[73] Assignee: ABB Power T&D Company Inc., Raleigh, N.C.

[21] Appl. No.: 09/039,881

[22] Filed: Mar. 16, 1998

[51] Int. Cl.⁶ ............................................. H02H 3/00
[52] U.S. Cl. ............................ 361/66; 361/62; 361/90; 702/59
[58] Field of Search .................. 361/62–66, 93.1, 361/93.2, 107, 91.1, 92, 90, 79; 702/59, 62

[56] References Cited

U.S. PATENT DOCUMENTS

| | | | |
|---|---|---|---|
| 4,471,399 | 9/1984 | Udren | 361/64 |
| 4,816,988 | 3/1989 | Yamanaka | 364/188 |
| 4,972,290 | 11/1990 | Sun et al. | 361/64 |
| 5,237,659 | 8/1993 | Takats | 395/200 |
| 5,452,465 | 9/1995 | Geller et al. | 395/800 |
| 5,455,776 | 10/1995 | Novosel | 702/59 |
| 5,475,867 | 12/1995 | Blum | 455/53.1 |
| 5,490,134 | 2/1996 | Fernandes et al. | 370/79 |
| 5,583,793 | 12/1996 | Gray et al. | 709/223 |
| 5,627,759 | 5/1997 | Bearden et al. | 702/62 |
| 5,648,888 | 7/1997 | LeFrancois et al. | 361/603 |
| 5,661,664 | 8/1997 | Novosel et al. | 702/59 |
| 5,715,134 | 2/1998 | Maineult et al. | 361/604 |

OTHER PUBLICATIONS

Press Release, "GE harris and Stellar Dynamics Form 'Engineered Solutions Team' to Deliver Integrated Automation System," GE Harris Energy Control System, Jan. 4, 1998.

"IEEE Recommended Practice for Monitoring Electric Power Quality," IEEE Std. 1159–1995, Nov. 2, 1995.

IEEE Recommended Practices and Requirements for Harmonic Control in Electrical Power Systems, IEEE Std 519–1992, Apr. 12, 1993.

Brochure for SCD96, GE Harris Energy Control Systems Canada, Inc. 1997 (No month).

Brochure, Auto–Restoration, GE Harris Control Systems Canada, Inc., 1997 (No month).

Brochure "WESDAC Feeder Automation," GE Harris Energy Control Systems Canada, Inc., 1997 (No month).

Brochure, "WESDAC Substation Automation," GE Harris Energy Control Systems Canada, Inc., 1997 (No month).

Brochure, "Backgrounder Engineering Powerful Solutions for Utility Automation, " GE Harris Energy Control Systems Canada, Inc., 1997 (No month).

Brochure, "Auto–Sectionalizing," GE Harris Energy Control Systems Canada, Inc., 1997 (No month).

Brochure Powerlink™ SCADA Master, GE Harris Energy Control Systems Canada, Inc., 1996 (No Month).

Brochure Substation Control System, Harris Distributed Automation Productions, Div. of Harris Canada, Inc., 1996 (No Month).

Data Sheet, Harris DART Feeder RTU, Harris Corporation, 1995 (No Month).

Brochure, "Harris DART Feeder RTU—Automation Applicatons" Harris Corporation, 1995 (No Month).

(List continued on next page.)

*Primary Examiner*—Michael J. Sherry
*Attorney, Agent, or Firm*—Woodcock Washburn Kurtz Mackiewicz & Norris LLP

[57] ABSTRACT

A system for monitoring and controlling an electrical distribution network comprises an electrical distribution substation having a local area network (LAN), a feeder subsystem and a gateway. The feeder subsystem is coupled to the substation and receives electrical energy therefrom for distribution to customers, and includes slave devices for performing switching functions. The gateway provides remote access to the slave devices and the LAN.

30 Claims, 10 Drawing Sheets

OTHER PUBLICATIONS

Press Release, "China Light and Power AWards GE Harris Multi–Million Dollar Distribution Automation Contract," GE Harris Energy Control Systems, Dec. 9, 1997.

Press Release, New GE Harris Joint Venture Rpoerts Record First Year in 1997 Industry Report Names GE Harris Top Supplier in Its Segment, GE Harris Energy Control Systesm, Jan. 7, 1998.

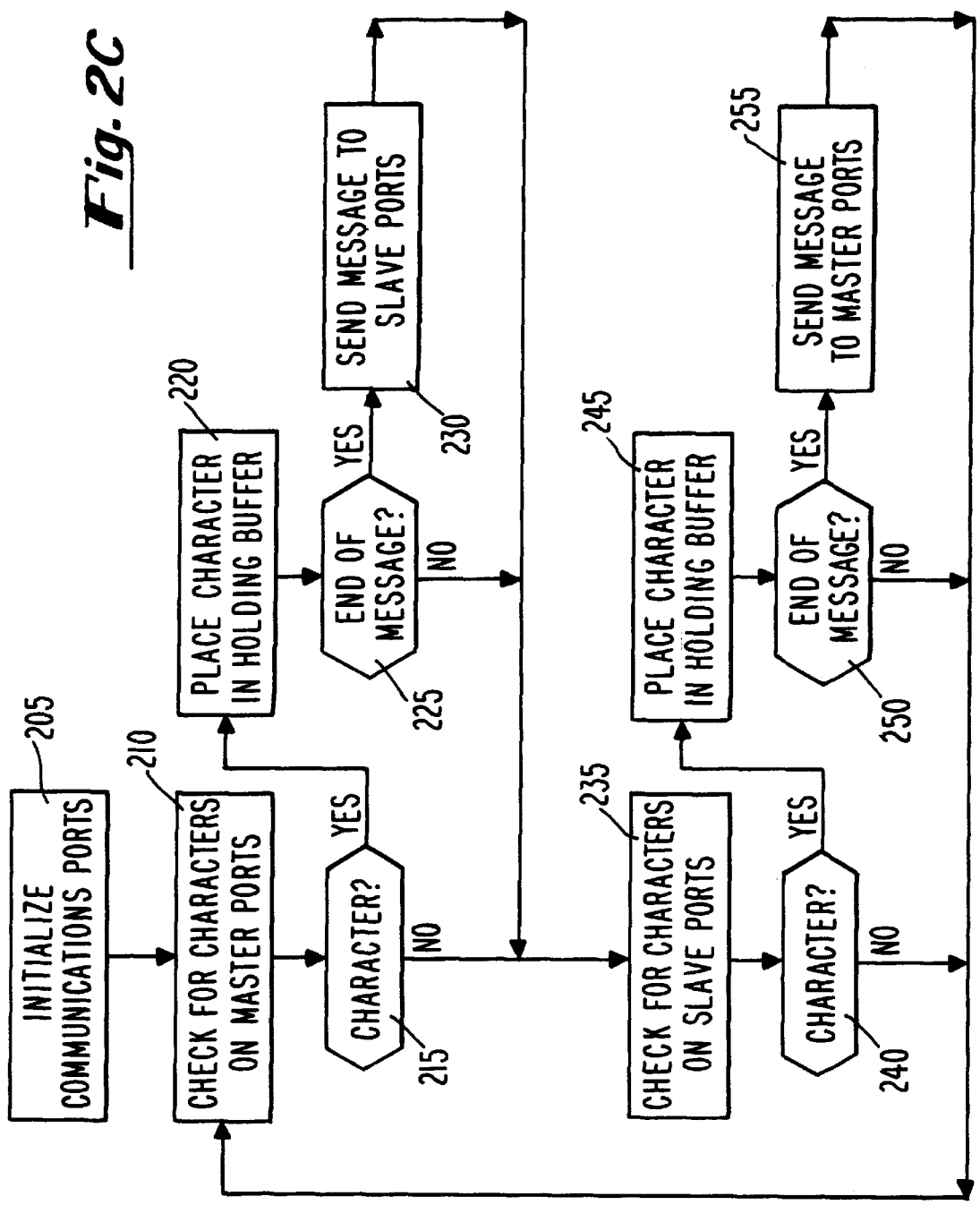

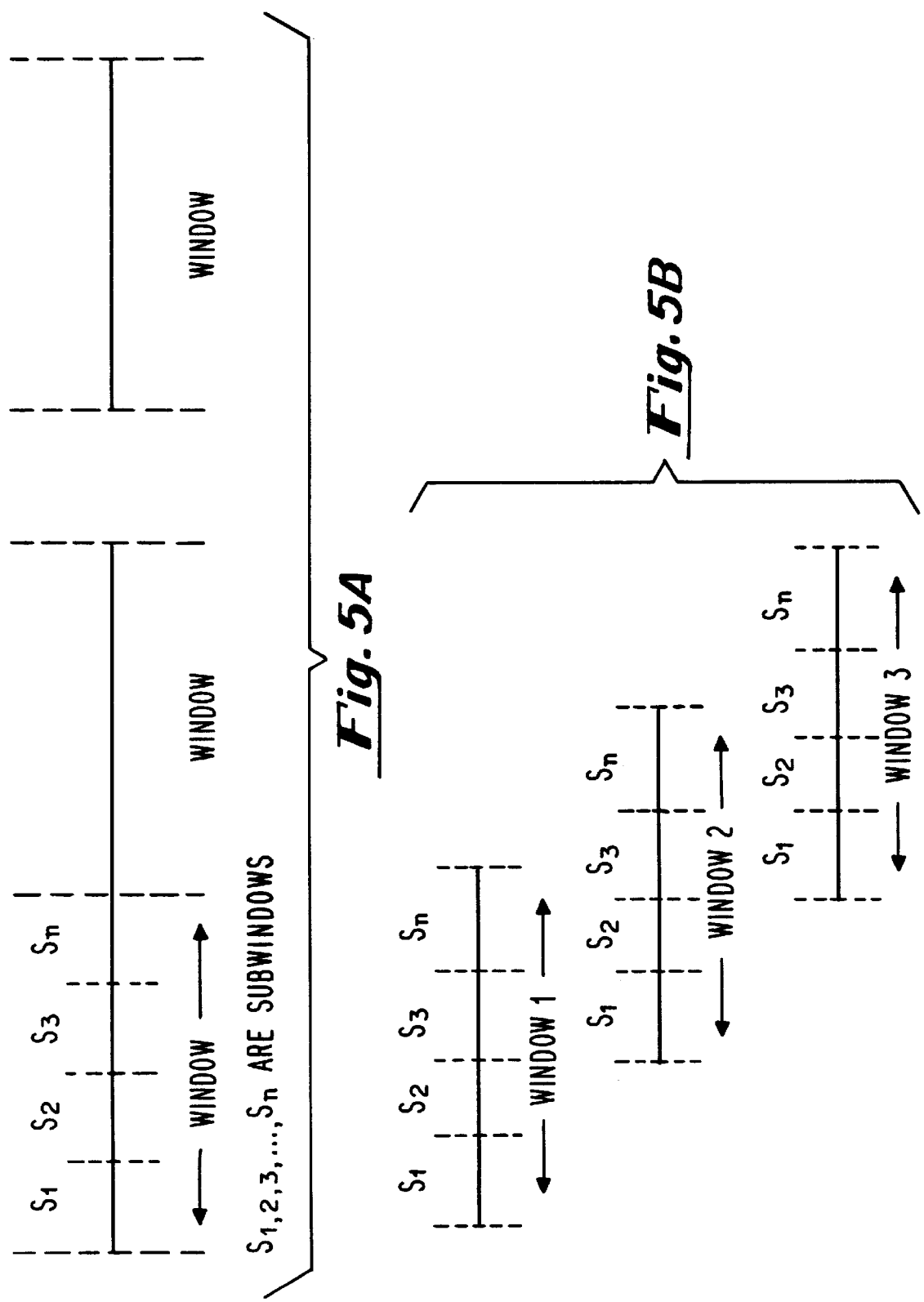

Hexadecimal Representation of the Request
1>S: Length - 017 Function = 0x03 Destination = 0x01
3A 30 31 30 33 30 31 30 30 30 30 30 31 46 41 0D
0A

ASCII Representation of Request
: 0 1 0 3 0 1 0 0 0 0 0 1 F A . .
- Line Feed [0A]
- Carriage Return [0D]
- Checksum (FA)
- Number of Points (0001) = 1
- Requested Register [D (0100) = 256
- Function Code 3 (03)
- Unit Address (01)
- Start of Message [3A]

Hexadecimal Representation of the Response
3>1: Length = 015 Function - 0x03 Source - 0x01
3A 30 31 30 33 30 32 30 30 30 35 46 35 0D 0A

ASCII Representation of Response
: 0 1 0 3 0 2 0 0 0 5 F 5 . .
- Line Feed [0A]
- Carriage Return [0D]
- Checksum (F5)
- Data (0005) = 5
- Number of Bytes in Response (02) - 2
- Function Code 3 (03)
- Unit Address (01)
- Start of Message [3A]

*Fig. 6A*

MODBUS Request
1>S: Length = 017 Function = 0x03 Destination = 0x01
3A 30 31 30 33 30 31 30 30 30 30 30 31 46 41 0D
0A

DNP 3.0 Encapsulated MODBUS Request Object 70
6>S: Length = 030 Control = 0xC4 Destination = 0x0001 Source = 0x1000
05 64 1E C4 01 00 00 10 AF B7 C3 C3 02 70 11 00
00 00 3A 30 31 30 33 30 31 30 D8 C9 30 30 30 30
31 46 41 0D 0A E7 04

DNP 3.0 Slave Response for Requiring Restart (If time has not been set)
3>M: Length = 010 Control - 0x44 Destination = 0x1000 Source = 0x0001
05 64 0A 44 00 10 01 00 40 EE C2 C3 81 92 00 33
7B

DNP 3.0 Read Data from Object 71
6xS: Length = 011 Control = 0xC4r Destination - 0x0001 Source = 0x1000
05 64 0B C4 01 00 00 10 E7 37 C4 C4 01 71 00
06 30 04

DNP 3.0 Encapsulated MODBUS Response from Slave Object 71
3>M: Length = 030 Control - 0x44 Destination = 0x1000 Source = 0x0001
05 64 1E 44 00 10 01 00 EF DB C3 E4 81 92 00
71 0F 17 01 00 3A 30 31 30 33 30 56 51 32 30
30 30 34 46 36 0D 0A 37 AD

DNP Application Confirm
6>S: Length - 008 Control - 0xC4 Destination - 0x0001 Source - 0x0001
05 64 08 C4 01 00 00 10 B7 A4 C5 C4 00 A1 DE

MODBUS Response
7>M: Length = 015 Function = 0x03 Source = 0x01
3A 30 31 30 33 30 32 30 30 30 34 46 36 0D 0A

*Fig. 6B*

METHOD AND SYSTEM FOR MONITORING AND CONTROLLING AN ELECTRICAL DISTRIBUTION NETWORK

FIELD OF THE INVENTION

The present invention relates generally to information distribution systems for electrical utilities, and more particularly to improved methods and systems for providing an interface between an electrical distribution substation and a feeder subsystem, and for providing remote access to terminals in the feeder subsystem.

BACKGROUND OF THE INVENTION

The recent deregulation of the utility industry has created a market for products that facilitate the efficient distribution and monitoring of electrical power. In the past, utilities have built systems that worked in a coordinated but independent fashion, and did not provide easy access to certain information necessary to adequately monitor and control a substation, or multiple substations, and related feeder networks and the like from a central location. (Electrical distribution substations and the equipment used therein, such as transformers, circuit breakers, disconnect switches, etc., are well known. See, e.g., U.S. Pat. No. 5,648,888, Jul. 15, 1997, titled "Power Distribution Substation," for background information regarding such substations.) For example, separate devices have been used to monitor a power system to determine when an event, such as loss of power, reduction in supplied voltage, distortion of the voltage or current waveform, or the like, has occurred on the system. One reason to monitor power quality is economic, e.g., poor power quality will affect equipment and processes and can result in misoperation and damage of equipment, disruption of operations, and other such anomalies. Moreover, a consumer, such as a business, may now be able to choose its utility provider, and therefore the customer may now have a need or desire to determine the quality of the power supplied by its present supplier. Similarly, the utilities have a need to monitor the power they supply to customers to ensure that they are providing power of sufficient quality to retain their customers. Therefore, utilities and consumers are now in need of systems to coordinate functionality, such as power quality monitoring, through a network. One aspect of the present invention concerns a system for enabling a utility or one of its customers (such as a large consumer of power) to remotely access equipment for monitoring power quality.

SUMMARY OF THE INVENTION

The present invention is directed to an electrical distribution system comprising an electrical distribution substation having a local area network (LAN), a subsystem coupled to the electrical distribution substation, the subsystem receiving electrical energy from the electrical distribution substation for distribution to customers and including slave devices and a gateway operatively coupled to said LAN and the subsystem for providing access to the slave devices and the LAN via at least one prescribed protocol.

According to one aspect of the present invention, a controller is coupled to the gateway for monitoring power quality events.

In accordance with an aspect of the present invention, the power quality events comprise voltage swell, overvoltage, voltage sag, undervoltage, interruption, total harmonic distortion, and/or total demand distortion. The total harmonic distortion and total demand distortion are determined using a back-to-back non-overlapping window scheme or a moving window scheme.

In accordance with a further aspect of the present invention, power quality algorithms are used by at least one of the slave devices, and the data produced thereby is accessible by a remote application via the gateway. Preferably, at least one of the slave devices comprises a relay and signal processing means and the power quality algorithms are used by the signal processing means.

In accordance with a further aspect of the present invention, the power quality events are monitored using predefined thresholds, preferably tunable.

According to a further aspect of the present invention, memory means is provided for recording a start time, a duration, a measured phase, a magnitude of a measured quantity, and a predisturbance value for each of the power quality events. Optionally, a waveform is recorded in the memory for each of the power quality events.

In accordance with a further aspect of the present invention, at least some of the slave devices communicate with the gateway via wireless radio communications.

According to a further aspect of the present invention, the system further comprises at least one master application coupled to the gateway and having access to the slave devices and the LAN. The master application is an off-line application or a real-time application. The off-line application is personal computer-based and communicates with the gateway using a modem.

According to further aspects of the present invention, the protocol comprises a first protocol encapsulated within a second protocol, and the second protocol is a standard protocol recognized by the LAN and at least one of the slave devices in the feeder subsystem. The first protocol is preferably MODBUS and the second protocol is preferably distributed network protocol. The gateway encapsulates the first protocol within the second protocol. The first protocol is recognized by at least one of the slave devices that unencapsulates the first protocol from the second protocol.

In a further embodiment within the scope of the present invention, a method of interfacing a master application with a plurality of slave devices via a gateway using a nonaddressable protocol is provided, comprising the steps of: building a request at the gateway responsive to a first message received from the master application, transmitting the request to the slave devices, starting a timer having a timeout period, checking the slave devices for a second message within the timeout period, and building a response at the gateway responsive to the second message and transmitting the response to the master application if one of the slave devices provides the second message within the timeout period.

Another embodiment within the scope of this invention includes a method of interfacing a master application with a plurality of addressable slave devices via a gateway using an addressable protocol, comprising the steps of: building a request having an address at the gateway responsive to a first message received from the master application, transmitting the request to one of the slave devices, the one of the slave devices having the address, checking the slave device at the address for a second message, and building a response at the gateway responsive to the second message and transmitting the response to the master application.

The term "slave device" as used herein refers to "intelligent," or microprocessor/DSP-based electronic devices employed in electrical distribution systems to control and monitor switches, circuit breakers, and other equipment.

The present invention provides the advantages of being less expensive and less complex than the prior art, thereby making remote monitoring along electrical distribution networks more economically and technologically feasible. Other features and advantages provided by the invention are disclosed below.

BRIEF DESCRIPTION OF THE DRAWINGS

FIG. 2C is a flow diagram illustrating the functionality of a second exemplary gateway in accordance with the present invention.

FIG. 5A is a diagram of an exemplary back-to-back non-overlapping windowing scheme used to determine total harmonic distortion and total demand distortion in accordance with the present invention.

FIG. 5B is a diagram of an exemplary moving overlapping windowing scheme used to determine total harmonic distortion and total demand distortion in accordance with the present invention.

FIGS. 6A and 6B depict examples of messages showing how a first protocol (MODBUS) is encapsulated in a second protocol (DNP) for transmission through a network in accordance with the present invention.

DETAILED DESCRIPTION OF THE PREFERRED EMBODIMENTS

The present invention is directed to a system for monitoring, controlling, and analyzing an electrical distribution network in substations, along feeders, and in industrial parks. A presently preferred embodiment of the invention integrates a number of traditionally independent and separate off-line analysis tools and applications with real-time data acquisition applications such as those used with distributed network protocol (DNP) SCADA communications. (SCADA refers to a system for performing centralized control of a power network, referred to as the supervisory control and data acquisition system, or energy management system. See, e.g., U.S. Pat. No. 4,471,399, Sep. 11, 1984, "Power-line Baseband Communication System.) Moreover, in accordance with the present invention, the off-line and real-time applications can obtain data from devices along feeders and industrial parks. The integrated system of the present invention provides end users with a common access point to data from a distribution network.

SYSTEM OVERVIEW

Figure 1:
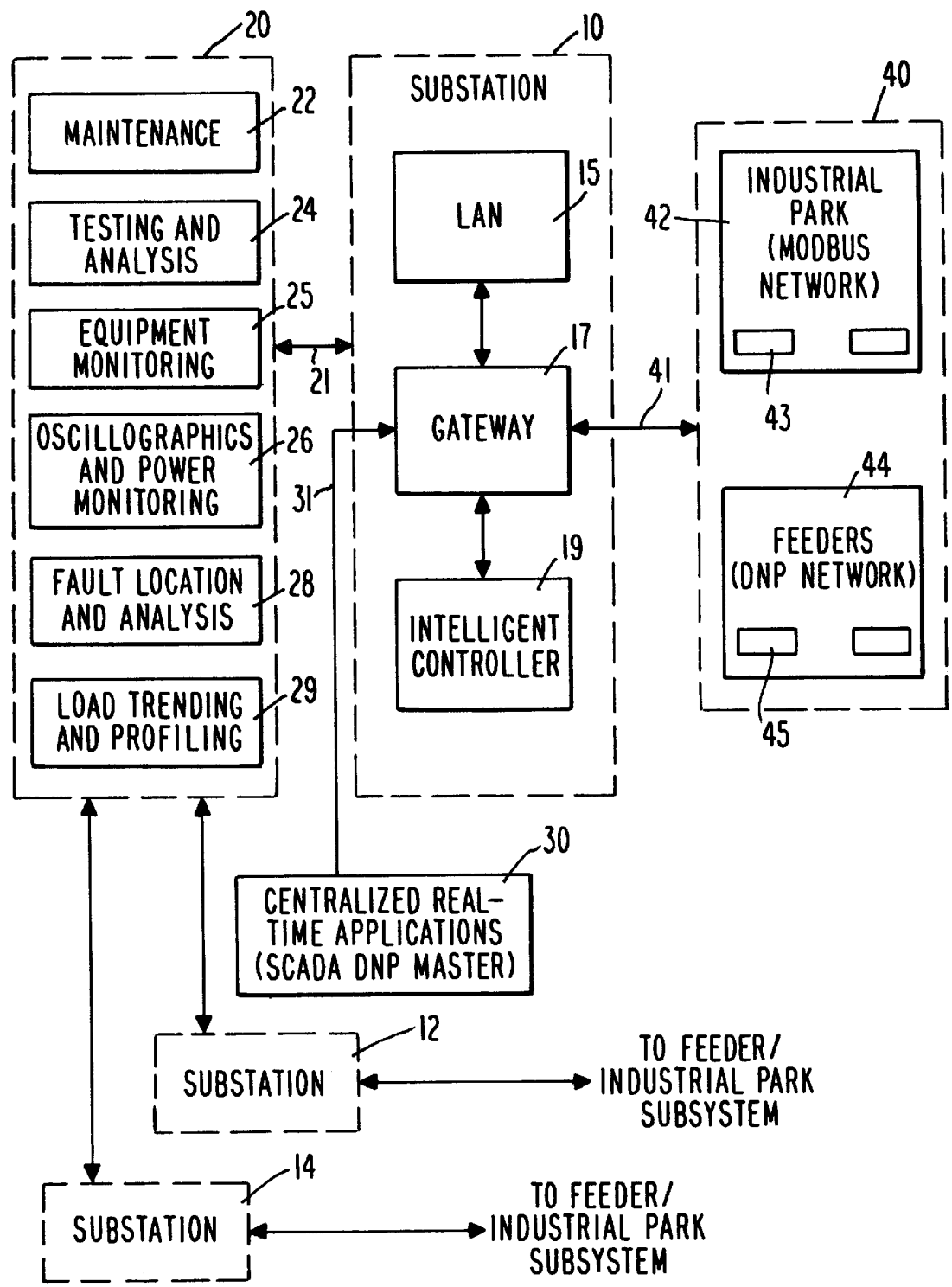
FIG. 1 is a functional block diagram of an exemplary electrical distribution network employing a gateway serving as an interface between a subsystem, off-line applications, and real-time applications in accordance with the present invention.

FIG. 1 is a functional block diagram showing the functional components of an exemplary electrical distribution network preferably comprising a substation, a feeder subsystem, off-line applications, and real-time applications that provide comprehensive power quality monitoring, diagnostics, and interfacing in connection with delivery of single and poly-phase electrical energy. The preferred embodiment employs a gateway serving as an interface between the subsystem, off-line applications, and real-time applications. As shown in FIG. 1, the system preferably includes a plurality of substations 10, 12, and 14, distributed off-line applications 20, centralized real-time applications 30, and a subsystem 40 comprising industrial parks 42 and feeders 44 that provide information through intelligent electronic devices (IEDs) 43 and 45.

The substation 10 comprises a local area network (LAN) 15, a gateway 17, and an intelligent controller 19. The LAN 15 is a conventional network comprising data processing units, circuit breakers, relays, and transmitters, e.g., a 485 twisted pair LAN. The gateway 17 provides a communications interface for data acquisition for remote devices and terminals on the off-line applications 20, the real-time applications 30, and the subsystem 40. The intelligent controller 19 (or switch controller) controls switching, provides fault indication and local/remote operation via communications or a local interface, and monitors power quality.

The substations 12 and 14 comprise similar components as the substation 10. Although three substations are shown in FIG. 1, it is to be understood that any number of substations can be used in conjunction with the network system of the present invention. Further, the substations can communicate with each other although this is not explicitly shown.

GATEWAY

The substation communications gateway 17 interfaces off-line applications 20 and real-time applications 30 (both also referred to herein as "master" applications) with the substation 10 so that the off-line applications 20 and the real-time applications 30 can access data from the substation. Moreover, the gateway 17 interfaces with IEDs (also known as IED "slaves") residing in subsystems, feeders, and industrial parks, thereby extending the data acquisition capability of the off-line and real-time applications to the subsystems, feeders, and industrial parks (i.e., subsystem 40). Thus, the off-line and real-time applications can receive, send, and exchange data directly from the subsystems, feeders, and industrial parks, in addition to the substations 10, 12 and 14.

The gateway 17 may communicate over a fiber, an RS232 port, or an RS485 port. Communication with the IEDs is preferably performed using either a DNP SCADA protocol or an ASCII MODBUS protocol, although the present invention is not limited thereto. The communication network is preferably either a 485 substation network or an unlicensed radio network. Radio communications can take place at, for example, about 400 MHz or about 900 MHz. Preferably, the gateway 17 is transparent to the applications and performs in a polled response environment. Thus, the gateway provides a digital transmission network that serves as an interface to conventional computer modems, wireless radios (e.g., spread spectrum 900 MHz), and computers.

Figure 2A:
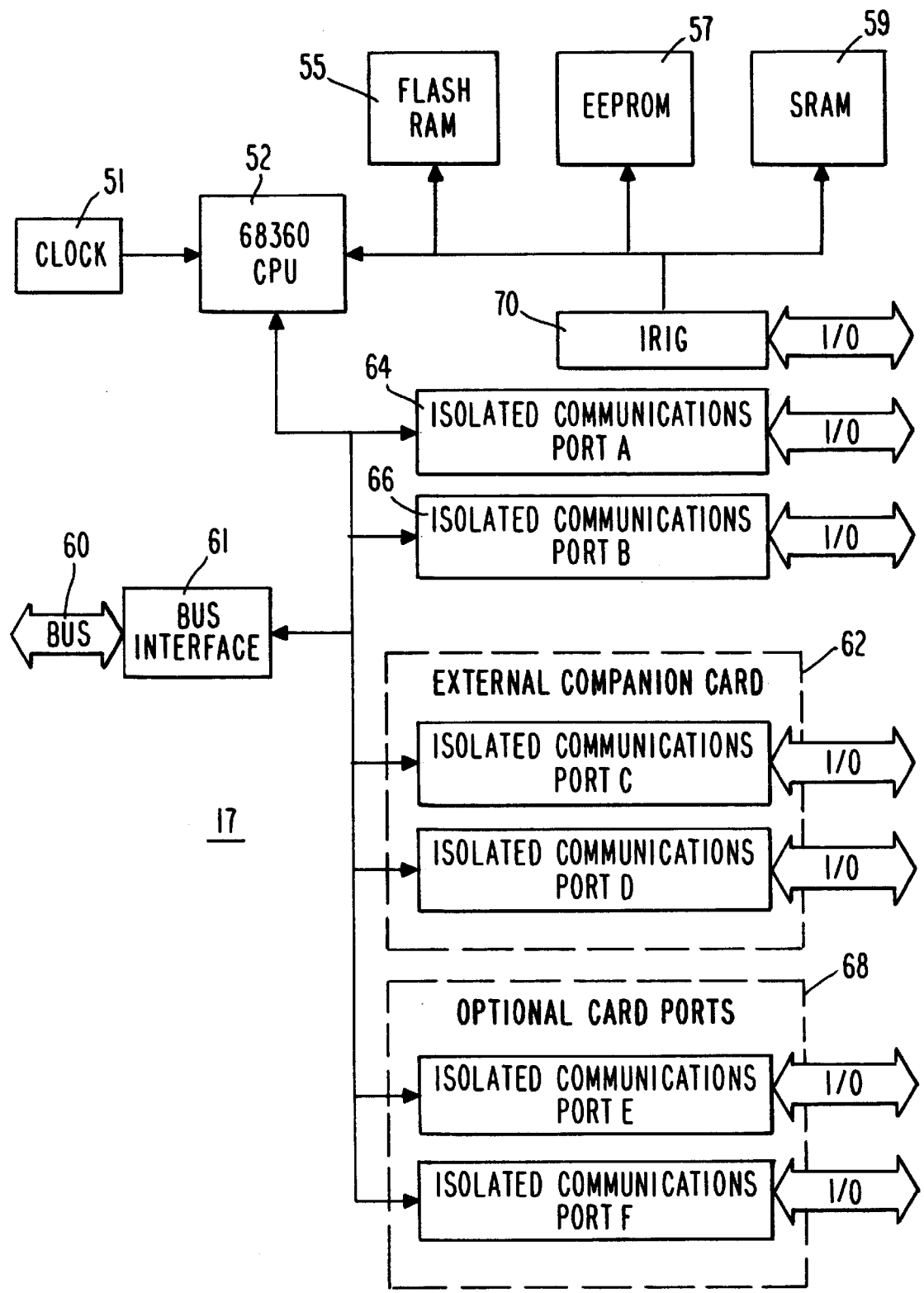
FIG. 2A is a functional block diagram of an exemplary gateway in accordance with the present invention.

A functional block diagram of an exemplary gateway 17 in accordance with the present invention is shown in FIG. 2A. As shown, the gateway 17 comprises a microprocessor 52 (e.g., a Motorola 68360 microprocessor) synchronized by a clock 51. Storage is provided in the form of memory, e.g., a 128K flash RAM 55, an EEPROM 57, and a 128K SRAM 59. A bus interface 61 is used to connect the gateway 17 to an input/output (I/O) bus 60 and allows communication with peripherals such as a Motorola 68332 processor, a front panel display, a front panel keyboard, a power supply card, and digital input and output cards. Peripherals share the common bus technology. I/O ports are provided in the form of an external companion communications card 62, isolated communications ports 64 and 66, and optional card ports 68. Also provided is an IRIG I/O port 70. (The IRIG port is a time synchronization input port. IRIG stands for Inter-Range Instrumentation Group and was originally developed to send time and other data around missile test ranges. The specific implementation here is the IRIG-B version which sends day of year, hour, minute, and second data on a 1000 Hz carrier and is updated every second.) The microprocessor 52 coordinates and translates communication traffic between the ports and from the ports on the I/O bus 60 to a host CPU, which is preferably located in a substation, an off-line or real-time application, or a subsystem.

The gateway 17 preferably provides RS-232 access for leased line masters, RS-232/modem access for masters connected to the substation via telephone lines and computers, and long distance radio access for network expansion masters. Moreover, the gateway preferably provides local and remote radio input and RS-485 input for IED slaves. The various desired accesses can be provided by communications cards.

As described above, the gateway is preferably a hardware device having supporting software to route serial communications messages between master applications and IED slaves. Messages are built, sent to slaves, and returned. In the prior art, an IED slave or network of IED slaves using a serial communications channel allows access to a single master application that is hardwired into the network. Multiple applications' access to the traditional network is accommodated in the prior art by changing the application at the access point. The level of sophistication of support for the multiple master applications in a network is partially dependent on the protocol used. The gateway in accordance with the present invention enhances the single point of access network by providing a single access port "in" with multiple network ports "out" in order to expand a network, and by providing multiple access ports "in" with multiple network ports "out" that are designed around specific protocols in order to allow multiple simultaneous access to the network by master applications. Moreover, the multiple applications are transparent to each other.

As described above, the gateway 17 is a hardware device with supporting software to link applications to intelligent electronic devices 43 and 45 that reside, for example, in the industrial park 42 and the feeders 44, respectively. The device supports serial communications interface standards, including RS232, IEEE 485, IEEE 422, fiber optic, radio, and modem. The gateway 17 functionally divides the communications network into a master side for applications and a slave side for the IEDs and adds the diagnostic capability to monitor network traffic. The gateway 17 permits the use of multiple master applications to access an IED slave or network of IED slaves where conventionally only one master application could access the network at a time. The gateway routing technique uses slave addressable protocols and can take advantage of more advanced protocols that provide master addressing as well as slave addressing. Individual device addressing is preferable to insure that only one device responds to a given request, and to thereby prevent collisions in certain types of networks.

Figure 2B:
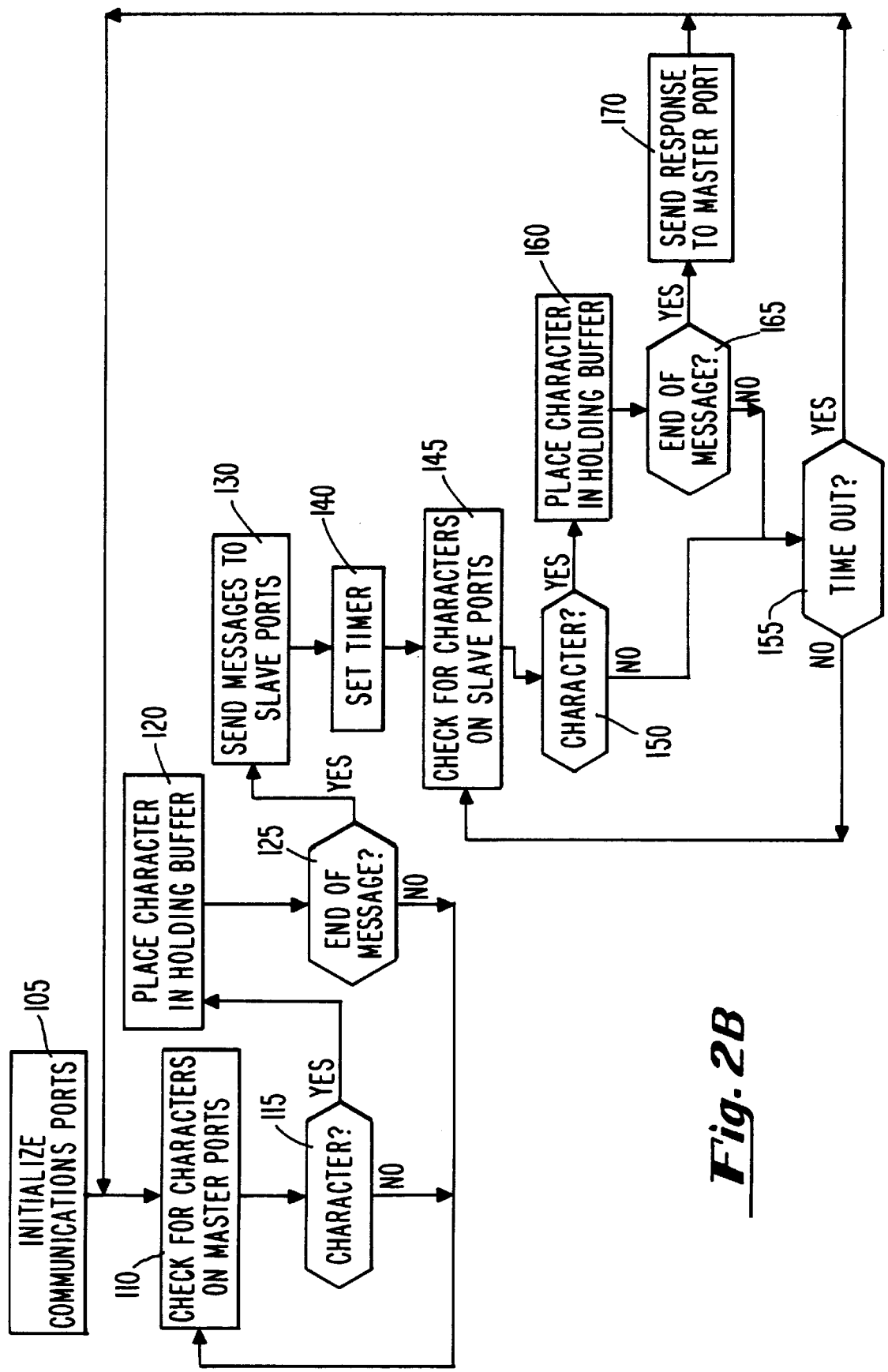
FIG. 2B is a flow diagram illustrating the functionality of a first exemplary gateway in accordance with the present invention.

Flow diagrams detailing the multiple access functionality of exemplary gateways are shown in FIGS. 2B and 2C. FIG. 2B shows the functionality for protocols that do not have master application addressing. In this mode, the gateway holds communications with the slave for a preset timeout period. If the slave completes a response within the preset time period, the response is routed back to the master port originating the request. Thus, as shown in FIG. 2B, the communications ports are initialized at step 105. The master ports are checked at step 110 for characters. If there is no character detected at step 115, processing returns to step 110. If there is a character detected at step 115, the character is placed in a holding buffer at step 120. The message is then checked at step 125 to determine if the character is the final character in the message and the message has ended. If the message has not ended, processing returns to step 110. If the message has ended, the message is sent to the slave ports at step 130. A timer is then set at step 140 and the slave ports are checked for characters at step 145.

If there is no character detected at the slave port at step 150, the timer is checked at step 155 to determine if there has been a timeout. If not, processing returns to step 145. If there is a timeout detected at step 155, processing continues at step 110.

If there is a character detected at the slave port at step 150, the character is placed in a holding buffer at step 160. The message is then checked at step 165 to determine if the character is the final character in the message and the message has ended. If the message has not ended, processing continues at step 155. If the message has ended, the message is sent as the response to the master port at step 170, and processing returns to step 110.

The second mode involves addressable master applications and is shown in FIG. 2C. In this case, the messages from the slaves are broadcast to the masters and messages from masters are broadcast to the slaves. In this mode, no time slice is needed for the slaves to respond. Unlike the process of FIG. 2B, timing is not an issue. Thus, as shown, the communications ports are initialized at step 205. The master ports are checked at step 210 for characters. If there is a character detected at step 215, the character is placed in a holding buffer at step 220. The message is then checked at step 225 to determine if the character is the final character in the message and the message has ended. If the message has ended, the message is sent to the slave ports at step 230.

If there is no character detected at step 215, or if the message has not ended at step 225, or after the message is sent to the slave ports at step 230, processing continues by checking for characters on the slave ports at step 235. If there is no character detected at step 240, processing returns to step 210. If there is a character detected at the slave port at step 240, the character is placed in a holding buffer at step 245. The message is then checked at step 250 to determine if the character is the final character in the message and the message has ended. If the message has not ended, processing returns at step 210. If the message has ended, the message is sent as the response to the master port at step 255, and processing returns to step 210.

In either of the above cases, there are no restrictions on the number and type of communications ports as long as they can be serviced by the software in a reasonable time. Moreover, the gateway builds strings until a message is built or complete. The message is then sent to a slave. The first message that is completed is sent. Preferably, the buffers are flushed or cleaned after a message is sent. Protocols requiring inter-character delays to determine the end of a message can also be used by replacing the mechanism to fill the holding buffer with another mechanism to place characters into the buffer and set the end of message indications.

DISTRIBUTED OFF-LINE APPLICATIONS

As described above, the present invention integrates off-line communications applications 20 (FIG. 1) with conventional real-time communications applications 30, such as DNP SCADA applications, by providing dial-in communications capability to the off-line applications 20. It should be noted that conventional real-time data acquisition applications such as SCADA typically do not have dial-in capabilities. Dial-in capability is preferable for remote geographical substations and users, such as customer service representatives and customers, who are to have limited data acquisition capabilities.

The off-line applications 20 are preferably distributed and personal computer-based (PC-based) and can communicate with the substations 10, 12, and 14 and subsystem 40 using the communications gateway 17. The dial-in function is preferably performed with a computer and a modem.

Distributed PC-based off-line applications 20 are those that monitor, control, and/or analyze data and data acquisition using dial-in communications. The off-line applications 20 are distributed among PCs and use a conventional relational database, which is preferably a common database; therefore, multiple users can access the data from any one of the distributed applications. FIG. 1 shows exemplary distributed off-line applications 20 employed by presently preferred embodiments of the present invention. The exemplary distributed off-line applications include reliability centered maintenance 22, breaker and protection analysis and testing 24, equipment monitoring 25, oscillographics and power quality analysis 26, fault location and analysis 28, and load trending and profiling 29. These are summarized below.

1. The equipment scheduler application 22 for reliability centered maintenance provides the capability to manually enter single event or repeating periodic schedules, such as maintenance, for distribution equipment. One example is remote control of a feeder capacitor bank. The scheduler automatically dials in to the affected device and performs the scheduled control when the schedule time is reached.

2. The equipment analysis and testing application 24 provides off-line capability to remotely test distribution equipment. For example, a remote battery test could be periodically scheduled using the equipment scheduler.

3. The equipment monitoring application 25 provides off-line capability to monitor the operational state of distribution equipment. Monitoring includes both present operational state and accumulation of historical operation such as the number of switching operations.

4. The oscillographics and customer event/power quality (PQ) monitoring and analysis application 26 retrieves records of events that potentially could affect the customers' load or the power system operation. These events include voltage sags, voltage swells, interruptions, total harmonic voltage distortion, and total current demand distortion, along with oscillographic records for each event. The oscillographics can be triggered based on the power quality triggers that can be stored in a cyclic memory.

5. A radial feeder fault location and analysis application 28 determines the location of a fault on a main feeder by an intelligent systematic dial-in to feeder monitoring devices combined with one-terminal or two-terminal fault location algorithms, such as those disclosed in U.S. Pat. No. 5,661,664, Aug. 26, 1997, "One Terminal Data Fault Location System and Process for Locating a Fault" (Novosel et al.), and U.S. Pat. No. 5,455,776, Oct. 3, 1995, "Automatic Fault Location System" (Novosel), which are hereby incorporated by reference in their entirety. A loop feeder/industrial park fault location application that determines the location of a fault on a closed loop main feeder served by two sources by using sampled voltage and current data at both sources may also be employed. As an alternative to being implemented as an off-line application, the loop feeder/industrial park fault location application can be implemented with a local intelligent controller 19.

6. The load trending and profiling application 29 may also be provided. The trending is preferably directed to years, and the profiling is preferably directed to days or months.

7. A further type of distribution application that can be integrated into the system of the present invention is an optimal voltage and var schedule application (not shown in FIG. 1) that minimizes real-power losses on distribution feeders by controlling feeder capacitor banks subject to desired operating voltage limits and equipment switching limitations. As an alternative to being implemented as an off-line application, the optimal voltage and var schedule application can be implemented with a local intelligent controller 19.

INTELLIGENT CONTROLLER

The controller 19 in the substation 10 provides power quality monitoring in addition to its other functions of switching, providing fault indication, switch failure, and phase imbalance, and initiating local/remote operation. The controller 19 is suitable for poletop or padmount switches. Local communications take place within the substation 10, preferably using a 485 twisted pair LAN and short distance radio. Remote communications provide communications from the field installed IED slave devices residing in the subsystems, feeders, and industrial parks to the substation or between substations, preferably using unlicensed spread spectrum radio. The network can use any device addressable protocol, preferably MODBUS and DNP standard protocols.

Figure 3A:
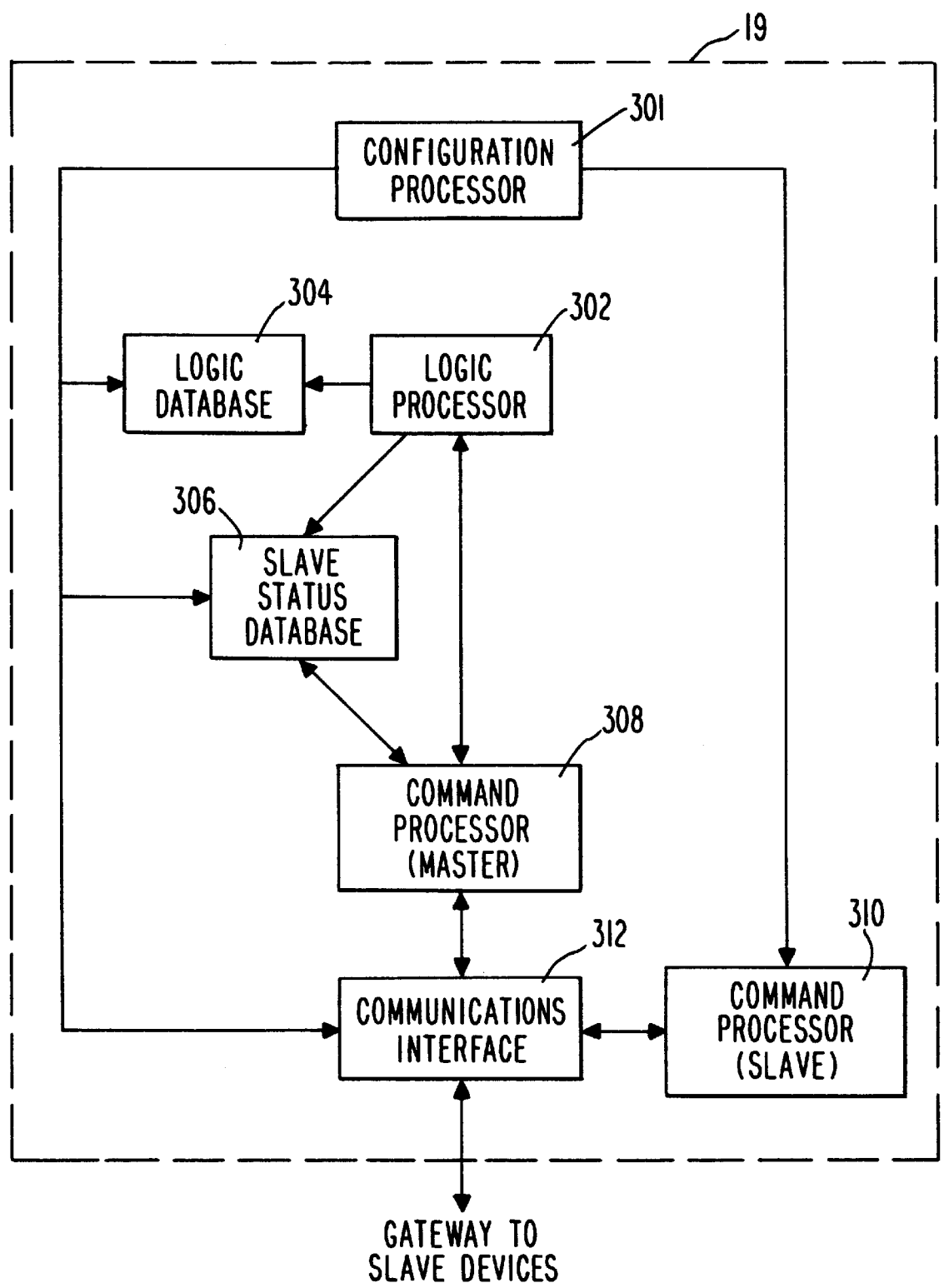
FIG. 3A is a functional block diagram of an exemplary intelligent controller in accordance with the present invention.

A functional block diagram of an exemplary intelligent controller in accordance with the present invention is shown in FIG. 3A. A configuration processor 301 sets the operating configuration of the controller 19. The controller 19 comprises a logic processor 302 in communication with a logic database 304, a slave status database 306, and a master command processor 308. The logic processor 302 provides processing control to the databases 304 and 306 and the master command processor 308. The master command processor 308 and a slave command processor 310 provide processing instruction to the slave devices through a communications interface 312 which connects to a gateway.

Distributed substation-based control applications are decentralized control applications that use a local intelligent controller 19 to monitor substation and feeder voltages, currents, and statuses to control certain feeder switches in real-time, preferably using SCADA.

A first type of distributed substation-based control application that can be integrated into the system of the present invention is a voltage and var optimal control application as described above with respect to the off-line applications 20.

Another type of distributed substation-based control application that can be integrated into the system of the present invention is an automatic sectionalizing application that automatically sectionalizes dual source feeders to minimize the dropped customer load following a fault.

POWER QUALITY MONITORING

The power quality monitoring system of the present invention monitors the system voltages and currents to monitor and record power quality disturbances and provides information to a utility or customer about disturbances that adversely affect a customer's load or the power system. Power quality (PQ) events are monitored by the intelligent controller 19 (FIG. 1) and are integrated into existing field equipment having signal processing capability such as a recloser, switch, or relay device. In the relays, etc., the signal values desired to calculate the events are already present. The present invention calculates the events based on these existing signal values. The events or disturbances that are monitored include instantaneous and momentary voltage swell, overvoltage, instantaneous and momentary voltage sag, undervoltage, and momentary, temporary, and sustained interruptions, total harmonic distortion, and total demand distortion. For each PQ event, a record is stored that indicates the start time of the event, the event duration, phase involved, and voltage magnitude. Automatic oscillographic waveform capture is preferable for each event type, as is root mean square trending. A counter is maintained for each event type that gives a running total of each event type. The PQ measurement and determination programs can be stored in an EEPROM.

The minimum and maximum voltage magnitudes are tunable for each event type. The time duration required before an event is determined to have occurred is also tunable. The user can remotely retrieve and display PQ statistics and time stamped events. The data can be downloaded from the feeders and industrial parks and the substation. A user can dial-in from the dial-in applications 20 (FIG. 1) described above to download the information to monitor the power quality.

Table 1 shows typical PQ event types, typical durations, and typical voltage magnitudes. These values can be tuned or changed as the user desires. Additional preferred values are found in the IEEE standards "IEEE Recommended Practice for Monitoring Electric Power Quality (IEEE Std 1159-1995)" and "IEEE Recommended Practices and Requirements for Harmonic Control in Electrical Power Systems (IEEE Std 519-1992)," which are hereby incorporated by reference for their teachings on power quality monitoring.

TABLE 1

| PQ Event Type | Duration | Voltage Magnitude |
|---|---|---|
| Instantaneous Voltage Swell | 0.5–30 cycles | 1.1–1.8 pu |
| Momentary Voltage Swell | 30 cycles–3 seconds | 1.1–1.4 pu |
| Overvoltage | >1 minute | 1.1–1.2 pu |
| Instantaneous Voltage Sag | 0.5–30 cycles | 0.1–0.9 pu |
| Momentary Voltage Sag | 30 cycles–3 seconds | 0.1–0.9 pu |
| Undervoltage | >1 minute | 0.8–0.9 pu |
| Momentary Interruption | 0.5 cycles–3 seconds | <0.1 pu |
| Temporary Interruption | 3 seconds–1 minute | <0.1 pu |
| Sustained Interruption | >1 minute | 0.0 pu |
| Total Harmonic Distortion | 15 minutes | 0–20% |

The systems for performing power quality monitoring in accordance with the present invention are preferably implemented in firmware. Specifically, all of the above functional operations are enabled by the correct programming of the data. The PQ tests preferably form a predefined set of comparison tests. The comparison tests are preferably stored in records in a comparison test table, but can be stored in other forms in various types of memory. The PQ test table also may include information referencing a measurement record for the measurement to be tested by the referenced comparison test. The PQ test table additionally references threshold information for test comparisons from the thresholds table. The PQ test table comprises a preselected set of records. Each PQ test definition specifies the electrical measurement to perform, the phase or phases to test, the type of comparison to perform after the measurement, the value to compare the measurement against, the amount of time that the test must fail before an event is recorded, and the action to take in the event that a measurement exceeds a threshold.

Figure 3B:
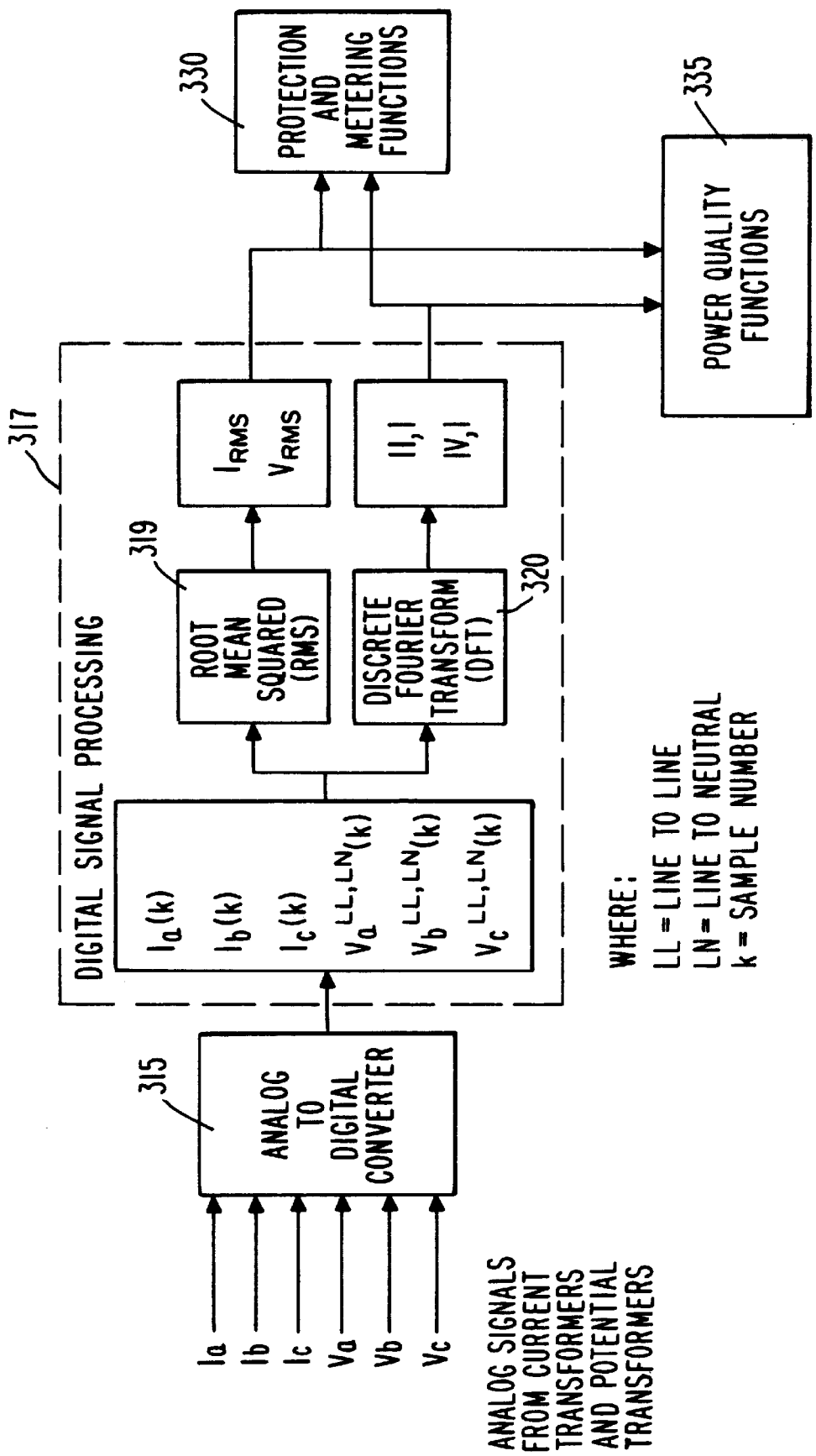
FIG. 3B is a functional block diagram of an exemplary power quality monitoring subsystem in accordance with the present invention.

Existing data acquisition and signal processing algorithms of power system protection devices are used to detect and record disturbances that could abnormally affect customers or the power system. A functional block diagram of the processing of an exemplary power quality monitoring subsystem in accordance with the present invention is shown in FIG. 3B.

Analog current and voltage signals Ia, Ib, Ic, Va, Vb, and Vc are collected from current transformers and potential transformers, assuming a three phase system. Analog voltage and current signals propagating over power transmission lines between the power generator of the electrical service provider and the users of the electrical energy are sensed by voltage dividers and current transformers or shunts, respectively (not shown). The outputs of the resistive dividers and current transformers, or sensed voltage and current signals, are provided to the inputs of an analog to digital (A/D) converters 315 for conversion to digital signals. The A/D converters 315 convert the sensed voltage and current signals into digital representation of the analog voltage and current signals. The digital voltage and current signals are then input to a programmable digital signal processor (DSP) 317 under control of a microprocessor for processing and the root mean square (RMS) of each of the signals is determined at RMS generator 319. The digital signals are also transformed using discrete Fourier transforms (DFTs) to compute the magnitude of the phasors at DFT generator 320. It should be noted that $I_1$ and $V_1$ represent the fundamental component of the current and voltage, respectively. The processed signals are sent to the standard protection and metering functions 330 and are also simultaneously sent in parallel to the power quality functions 335. The signals are then processed to generate signals representing various power and power quality measurements. Thus, in parallel with the protection and metering control functions, the power quality is determined, and the controller and DSP program in conjunction with the DSP hardware implements the fundamental PQ measurement capabilities. New PQ computations can be added by new combinations of DSP and controller functions and computations.

According to a preferred embodiment of the present invention, the digital phase voltage signals and phase current signals are monitored over two line cycles (at about 50 or 60 Hz, two line cycle measurements are defined herein as RMS measurements even though they are "near instantaneous"). The RMS values are computed for each phase A, B, and C and stored in a memory, preferably a RAM. The microprocessor polls for data in the RAM for power quality monitoring and processing. It should be understood that the number of line cycles is preferably programmable and a different number of line cycles may be used for designated measurements.

In a preferred embodiment, the RMS measurement generator computes the RMS measurements in accordance with Equation (1), using voltage as an example.

$$V_{rms} = \sqrt{\frac{\sum_{i=1}^{N} V_i^2}{N}} \qquad (1)$$

where N equals the number of samples per a selected number of line cycle intervals.

Voltage sag, voltage swell, voltage interruption, and total harmonic distortion use the RMS values of Va, Vb, and Vc. The total harmonic distortion also uses the DFT or instantaneous values of Va, Vb, and Vc. The total demand distortion use both the RMS and DFT values of Ia, Ib, and Ic.

For each event the following data is recorded: event type, start time, duration, measured phase, minimum or maximum magnitude of measured quantity, and pre-disturbance magnitude of voltage and current. A user is able to remotely retrieve the PQ statistics and time stamped events. Optionally, the waveform can be recorded.

Occurrence and event logs are available for recording information obtained through the PQ monitoring. The high and low threshold field is used to reference information to use as thresholds for the designated comparison or to reference information used to compute the thresholds for comparison.

The system may be programmed to increment event counters, totalize event times, set warning indicators, latch relays, and log event start and stop times when a measurement fails a test. The tests may be further qualified by timers such that a measurement fails a test for a programmable amount of time (e.g., 1 second to 60 minutes) before the programmed action occurs.

For voltage swells, each sample of each phase voltage is processed by four parallel voltage swell processing algorithms. Each algorithm processes a voltage swell event that is characterized by a voltage magnitude violation and a time duration. Each algorithm picks up when the voltage magnitude is greater than the pickup threshold for a time period greater than X cycles, where X is a predetermined positive real number. An event is recorded for the monitored phase if the voltage magnitude crosses below the algorithm's pickup threshold within the algorithm's time period.

For voltage sags, each sample of each phase voltage is processed by four parallel voltage sag processing algorithms. Each algorithm processes a voltage sag event that is characterized by voltage magnitude violation and a time duration. Each algorithm picks up when the voltage magnitude is less than the pickup threshold for a time period greater than Y cycles, where Y is a predetermined positive real number. An event is recorded for the monitored phase if the voltage magnitude crosses above the algorithm's pickup threshold within the algorithm's time period. It should be noted that thresholds can vary dependent on the length of time of a sag or a swell.

For voltage interruptions, each sample of each phase voltage is processed by a single voltage interruption processing algorithm. A voltage interruption event is characterized by a voltage magnitude dip below a tunable pickup threshold for a time period greater than Z cycles, where Z is a predetermined positive real number. The voltage interruption is preferably classified according to four discrete time periods depending on when the voltage returns above the pickup threshold. Although four time periods are used here, it is contemplated that any number of time periods can be implemented in accordance with the present invention.

Figure 4:
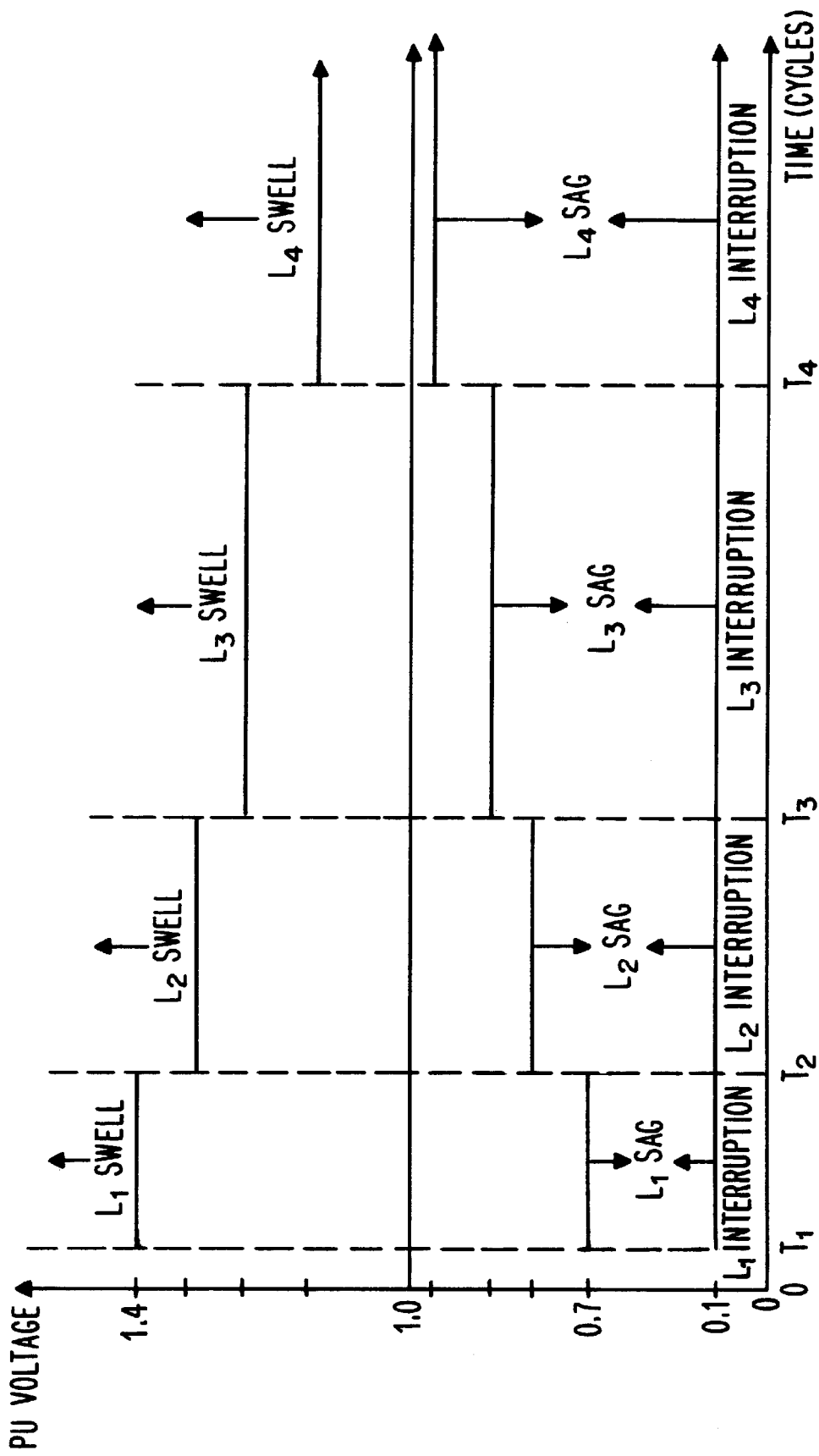
FIG. 4 is an exemplary diagram of per unit voltage vs. time with tunable thresholds for use in power quality monitoring in accordance with the present invention.

An exemplary diagram of per unit voltage vs. time with tunable thresholds for use in power quality monitoring in accordance with the present invention is shown in FIG. 4. The time thresholds $T_1$, $T_2$, $T_3$, and $T_4$ are cycle lengths that are tunable and are preferably stored in a memory. Two sets of tunable parameters are used, one set for voltage swells and the other for voltage sags and interruptions. For example, a voltage swell is determined to occur in the time measurement window between $T_1$ and $T_2$ if the voltage rises above 1.4 pu. A voltage sag is determined to occur in the time measurement window between $T_1$ and $T_2$ if the voltage falls below 0.7 pu. An interruption is determined to have occurred if the voltage falls below 0.1 pu. It should be noted that the four measurement periods shown (corresponding to $L_1$, $L_2$, $L_3$, and $L_4$) occur in series with each measurement being performed during different, non-overlapping periods of time.

Total harmonic distortion (THD) is determined for voltage and is computed in a user tunable window, for example 10, 15, 30, or 60 minutes, and compared against a tunable pickup threshold for a violation. The window type is user selected and can be either a moving set of overlapping windows or back-to-back non-overlapping windows. Total harmonic distortion for voltage is calculated every cycle and averaged over a subwindow period. The total harmonic voltage distortion is compared with a tunable threshold period.

Total demand distortion (TDD) is computed for sampled current in a user tunable window that is the same window period as the THD. TDD uses the same type windowing as the THD. THD is a measure of the harmonic content of the voltage as a percentage of the fundamental harmonic. TDD is a measure the harmonic content of the current as a percentage of the maximum load of the line.

THD and TDD are determined using either a back-to-back non-overlapping window scheme or a moving (also known as sliding or rolling) overlapping window scheme, as illustrated in FIGS. 5A and 5B, respectively. In FIG. 5A, a plurality of windows, each containing a number of subwindows, $S_1$, $S_2$, $S_3$, . . . , $S_N$, is used to determine the THD and TDD by monitoring the waveform in each subwindow S individually. In the case of moving windows, as shown in FIG. 5B, each window moves at an integer multiple of the subwindow periods so that the subwindow computations can be used in multiple windows. For example, the waveform can be used in the computation of THD and TDD in subwindow $S_3$ in Window 1 simultaneous with the computation of THD and TDD in subwindow $S_1$ in Window 2. In either case, the THD and TDD are determined as the average of the respective subwindow 20 categories. The equation for the subwindow average is shown in Equation (2) for THD.

$$THD_{window} = \frac{1}{NSW} \sum_{i=1}^{NSW} (THD_{subwindow})_i \qquad (2)$$

where NSW is the number of subwindows in a window.

The THD and TDD are computed in each subwindow as the average of the respective quantities computed on a cycle basis for every cycle within the window. The equation for the THD subwindow is shown in Equation (3).

$$THD_{subwindow} = \frac{1}{NCSW} \sum_{i=1}^{NCSW} (THD_{cycle})_i \qquad (3)$$

where NCSW is the number of cycles in a subwindow.

THD is computed for each electrical cycle as shown in Equation (4).

$$THD_{cycle} = \frac{\sqrt{\sum_{i=2}^{H} V_i^2}}{V_1} = \sqrt{\frac{V_{true}^2}{V_1^2} - 1} \qquad (4)$$

where H is the highest order harmonic computed at a given sampling rate, $V_1$ is the RMS value of the fundamental voltage, and $V_i$ is the RMS value of the ith harmonic of the voltage, and $V_{true}$ is given by Equation (5).

$$V_{true} = \sqrt{\frac{1}{N}\sum_{k=0}^{N-1} v_k^2} \qquad (5)$$

where $v_k$ is the kth voltage sample.

TDD is computed on an electrical cycle basis as given by Equation (6).

$$TDD_{cycle} = \frac{\sqrt{\sum_{i=2}^{H} I_i^2}}{I_{PEAK}} = \frac{\sqrt{I_{true}^2 - I_1^2}}{I_{PEAK}} \qquad (6)$$

where $I_1$ is the RMS value of the fundamental harmonic current, $I_i$ is the RMS value of the ith harmonic current, $I_{peak}$ is the RMS value of the peak demand current (demand current computed in the respective window period and the peak taken over a long time frame, preferably one year), and $I_{true}$ is given by Equation (7).

$$I_{true} = \sqrt{\frac{1}{N}\sum_{k=0}^{N-1} i_k^2} \qquad (7)$$

where $i_k$ is the kth current sample.

The peak load demand is manually entered to start the algorithm. A time stamped peak demand is recorded by the IED and is preferably substituted for the manually entered value after one year. The present invention uses a memory to determine the maximum over history and the percentage of the maximum. A trigger for display of the peak being used is provided.

In a preferred embodiment, each PQ test includes low and high warning action fields that are utilized for designating actions to take should an abnormal condition be detected. These actions might include a relay closure or logging an event.

ENCAPSULATING PROTOCOLS

The present invention allows a network of intelligent electronic devices (IEDs) to appear as a network of multiple protocol devices, e.g., as a network of MODBUS protocol network devices and a network of distributed network protocol (DNP) network devices. To implement the different network protocols for the same devices in the present invention, one of the protocols is encapsulated at an entry point into the other protocol and transmitted to the appropriate IED slave device, preferably based upon the address of the slave device, which removes the message and processes a return message that is sent back to the master application. This method allows reliable communications to the slave devices using any of the multiple protocols. The gateway 17 (FIG. 1) builds the message going out from the master application and coming in from the slave unit.

Thus, for example, the present invention allows the use of the MODBUS protocol on a network of intelligent electronic devices designed to communicate with the conventional DNP protocol. DNP is typically used as the protocol for SCADA. Though the two protocols can coexist on a serial network with some interference, the problem of having an addressable IED appear as a MODBUS device to a MODBUS application and appear as a DNP slave to DNP application cannot be readily implemented in the prior art without implementing separate command processors and communications interfaces at the IED. By encapsulating the MODBUS message in a DNP message, and allowing the IED to remove the MODBUS message and respond through a similar mechanism, the IEDs appear as being in either a full MODBUS and full DNP network.

DNP is selected as the host protocol for the network of IED slave devices because of its virtual terminal capability to carry messages between the slaves and master. MODBUS, which is a simpler protocol, is encapsulated at the entry point to the DNP network. It should be noted that any protocols can be used as the host protocol and the protocol that is to be encapsulated. The entry point can be a single entry point for an application, or it can act as a slave port on a larger MODBUS network. The virtual terminal feature of the DNP protocol was originally designed to interface dumb terminal applications to the IED directly. The present invention uses the same transport mechanism to deliver and receive commands using a non-DNP protocol over the DNP network.

The MODBUS/DNP interface is a hardware device comprising multiple serial communications ports, e.g., two serial communications ports. One communications port interfaces with a MODBUS network and acts as a slave device to the MODBUS network. The software for this port receives and parses the message fragments for routing onto the DNP network. The second communications port is connected to a DNP master program that generates the virtual terminal messages and polls the network for the reply. The DNP master program, upon receipt of the reply, removes the encapsulated message and sends it back to the MODBUS network. The addresses of the MODBUS IEDs and the DNP IEDs are identical.

The slave IED is modified to properly handle the encapsulated MODBUS message within the DNP protocol. The slave DNP driver receives the DNP addressed message and parses out the complete MODBUS message. The complete message is submitted to a MODBUS command processor routine that generates a response and returns it to the slave DNP driver. The slave, when polled, will return the MODBUS response encapsulated in a DNP message to the interface master.

FIG. 1 shows a block diagram of an exemplary mixed MODBUS/DNP network comprising masters and slaves employing different protocols. A first protocol, e.g., MODBUS, is encapsulated into a second protocol, e.g., DNP, for communications over the network in accordance with the present invention. A MODBUS master application, such as an off-line application 20, sends a request over a MODBUS network 21, such as a telephone line, to a MODBUS/DNP interface residing in the gateway 17. The interface embeds the MODBUS protocol into DNP protocol, as described below in further detail with respect to FIGS. 6A and 6B. The interface transmits the embedded MODBUS protocol over a network 41 (which is a network having one protocol, such as DNP network or a MODBUS network), such as a radio network, to a desired IED slave device 43 or 45.

One such IED slave device is a DNP slave device 45, which is shown as residing in the feeder 44 (on a DNP network, in this embodiment), but can also reside in an industrial park or elsewhere in a subsystem in a DNP network or the substation LAN 15. The DNP slave device 45 is a standard DNP device that interprets and acts on DNP protocol requests. DNP data requests to the slave IED originate from a DNP master attached to the network through a gateway master port 31. The DNP request is broadcast through a network 41 (in this embodiment, a DNP network) and to the local substation LAN 15. The addressed IED slave processes the request and returns a DNP protocol response which is returned either through the network 41 or through the substation LAN 15. The response is routed back to all connected DNP masters on the gateway master port 31.

Another type of slave device is a MODBUS slave device 43 that is shown as residing in the industrial park 42 (on a MODBUS network, in this embodiment), but can also reside in a feeder or elsewhere in a subsystem on a MODBUS network. The MODBUS slave device 43 interprets and acts on MODBUS protocol. Accordingly, the received embedded MODBUS protocol is stripped of its DNP encapsulation by a DNP command processor within the MODBUS slave device 43. The unembedded or original MODBUS command is then transmitted to a MODBUS command processor via an internal message exchange where it is processed by the MODBUS slave device 43. After the MODBUS slave device 43 processes the request from the MODBUS application 20, the device 43 prepares a MODBUS protocol response at the MODBUS command processor and transmits it to the DNP command processor via an internal message exchange where it is encoded or encapsulated in DNP protocol for transfer over the (MODBUS) network 41. The encoded DNP response is converted to its original MODBUS protocol at the MODBUS/DNP interface in the gateway 17 and then sent to the MODBUS application 20.

It should be noted that the above description, the device 43 is described with respect to the subsystem 40 being a MODBUS network, and the device 45 is described with respect to the subsystem 40 being a DNP network.

In a further embodiment, a DNP master application, such as a real-time SCADA application 30, is shown in FIG. 1 as being attached to the (DNP) network 41 through a gateway master port 31. The DNP master application 30 can send a DNP request to either the DNP slave device 45 or a DNP slave device that supports embedded MODBUS over the DNP network 41 or a DNP slave device on the substation LAN 15. The DNP requests are answered directly by the slave device DNP command processors. Preferably, there is no involvement from the MODBUS command processors or the network 21.

Moreover, the DNP application 30 can optionally be coupled to the MODBUS/DNP interface in the gateway 17 and its DNP protocol request converted to MODBUS and sent over the MODBUS network 21. The DNP application 30 can then receive MODBUS encapsulated responses over the MODBUS network 21 via the MODBUS/DNP interface.

FIGS. 6A and 6B depict examples of messages showing how a first protocol (MODBUS) is encapsulated in a second protocol (DNP) for transmission through a network in accordance with the present invention. FIG. 6A shows an exemplary MODBUS message sent from a MODBUS master application 20 to a slave device and the resulting slave reply, and FIG. 6B shows an exemplary MODBUS request sent from a MODBUS master application 20 to a DNP slave device which supports the embedded MODBUS processing. The initial request is in MODBUS protocol. It is then encapsulated or embedded in DNP and sent to the DNP slave device. The DNP slave device prepares a DNP response that is then sent to the DNP/MODBUS interface where the MODBUS protocol is stripped from the DNP response. The MODBUS protocol in the response is then transmitted to the MODBUS master application 20. Thus, an application can send a MODBUS request and receive a MODBUS response, or send a DNP request and receive a DNP response.

FIGS. 6A and 6B represent two different types of data exchanges. FIG. 6A involves a direct MODBUS request for register information, specifically the contents of register number 40257 using function code 3. FIG. 6B is the same MODBUS request going through DNP encapsulation. The MODBUS request shown in FIG. 6A is the ASCII version of MODBUS. Messages start with a colon (HEX 3A) and terminate with a checksum value (in this case HEX 41) followed by a carriage return-line feed (HEX 0D 0A). The two characters following the colon represent the address of the slave unit and preferably have values from 01 to FF (255 addressable units). The information following the address is the function code and supporting information for the function code.

For function code 3, the supporting data is the starting register ID number and the number of registers to return. Function code 3 will return the specified number of registers. In this example, one register starting at number 256 (binary 0100) is indicated.

The reply will have the same starting and ending information as the MODBUS request except that the supporting information for the function code is replaced by return data. In the example, the return data consists of a data field showing the number of bytes in the return message (one register=2 bytes), and the actual data, e.g., 5. Note that the reply message has the same address as the request. MODBUS is designed primarily to work with a single master application requesting data. The requests can be queued out and matched based on the address and function code of the return message.

The exemplary encapsulated MODBUS in DNP shown in FIG. 6B represents the same MODBUS request being received by the gateway. Note that the hexadecimal representation of the request message is identical. The message is then passed to DNP software, which encapsulates it as a type 70 object. The DNP message structure consists of a datalink header that starts the message with a HEX 05 64. The next byte indicates the length of the message (excluding CRC error checksums and the starting 05 64). In this example, the DNP request is 1E (decimal 30) bytes long. The fourth byte is a datalink control byte containing data link function and control information. The destination address is specified in the next two bytes with the least significant byte first. In this case, the address is 0001 or decimal 1. The final four bytes of the datalink header specify the message source address, in this example, 1000 (decimal 4096). A two-byte CRC follows the datalink header.

The next group of data make up the data blocks that will contain application information. The "C3 C3 02" make up the transport header (the first byte) and the applications header (the next two bytes). These are followed by the object header indicating object group 70, object variation 11, and qualifier 00. The MODBUS data packet follows, padded with 00. The message is presented in bold characters in FIG. 6B for easier identification. A CRC checksum will interrupt the data.

The response to the message is not returned by the DNP slave, and therefore it must be requested by the master application. In this case, the request for object 71 variation 00 qualifier 06 (return all) is made. The return message is encapsulated in a DNP reply format and returned. The DNP software strips the DNP from the message and returns the MODBUS reply. The DNP software will also send an application confirm to acknowledge receipt of the message.

Note that the MODBUS reply in FIG. 6B is 0004 instead of the 0005 of FIG. 6A. This is due to a change in the amount of current drawn through the current sensors.

This invention can be used with other packet-based protocols that provide addressability to the receiving device. In addition to Modicon MODBUS ASCII and RTU, and DNP 3.0, protocols such as IEC 870.5-110, PG&E 2179, Harris 5000/6000, Harris Micro 3, Landis & Gyr Telegyr 8979, and ABB Systems Control 1801 are examples of protocols that could be employed by the present invention.

Although illustrated and described herein with reference to certain specific embodiments, the present invention is nevertheless not intended to be limited to the details shown and described above. Rather, various modifications may be made in the details within the scope and range of equivalents of the claims and without departing from the invention.

What is claimed is:

1. An electrical distribution system comprising:
   an electrical distribution substation having a local area network (LAN);
   a subsystem coupled to said electrical distribution substation, said subsystem receiving electrical energy from said electrical distribution substation for distribution to customers and including slave devices; and
   a gateway operatively coupled to said LAN and said subsystem for providing access to said slave devices and said LAN via at least one prescribed protocol.

2. The system according to claim 1, further comprising a controller coupled to said gateway for monitoring power quality events.

3. The system according to claim 2, wherein said power quality events comprise voltage swell.

4. The system according to claim 2, wherein said power quality events comprise overvoltage.

5. The system according to claim 2, wherein said power quality events comprise voltage sag.

6. The system according to claim 2, wherein said power quality events comprise undervoltage.

7. The system according to claim 2, wherein said power quality events comprise interruption.

8. The system according to claim 2, wherein said power quality events comprise total harmonic distortion.

9. The system according to claim 8, wherein said total harmonic distortion is determined using one of a back-to-back non-overlapping window scheme and a moving overlapping window scheme.

10. The system according to claim 2, wherein said power quality events comprise total demand distortion.

11. The system according to claim 10, wherein said total demand distortion are determined using one of a back-to-back non-overlapping window scheme and a moving overlapping window scheme.

12. The system according to claim 2, wherein power quality algorithms are used by at least one of said slave devices and the data produced thereby is accessible by a remote application via said gateway.

13. The system according to claim 12, wherein said at least one of said slave devices comprises a relay and signal processing means and said power quality algorithms are used by said signal processing means.

14. The system according to claim 2, wherein said power quality events are monitored using predefined thresholds.

15. They system according to claim 14, wherein said predefined thresholds are tunable.

16. The system according to claim 2, further comprising a memory means for recording a start time, a duration, a measured phase, a magnitude of a measured quantity, and a predisturbance value for each of said power quality events.

17. The system according to claim 16, wherein a waveform is recorded in said memory means for each of said power quality events.

18. The system according to claim 1, wherein at least some of said slave devices communicate with said gateway via wireless radio communications.

19. The system according to claim 1, further comprising at least one master application coupled to said gateway and having access to said slave devices and said LAN.

20. The system according to claim 19, wherein said at least one master application includes one of an off-line application and a real-time application.

21. The system according to claim 20, wherein said off-line application comprises one of an equipment scheduler application, an equipment analysis and testing application, an equipment monitoring application, an oscilographics and customer event/power quality monitoring and analysis application, a radial feeder fault location and analysis application, a load trending and profiling application, and an optimal voltage and var schedule application.

22. The system according to claim 20, wherein said off-line application is personal computer-based and communicates with said gateway using a modem.

23. The system according to claim 1, further comprising a plurality of master applications coupled to said gateway and having access to said slave devices and said LAN.

24. The system according to claim 23, wherein each one of said plurality of master applications is one of an off-line application and a real-time application.

25. The system according to claim 1, wherein said protocol comprises a first protocol encapsulated within a second protocol, and said second protocol is a standard protocol recognized by said LAN and at least one of said slave devices in said feeder subsystem.

26. The system according to claim 25, wherein said first protocol is MODBUS and said second protocol is distributed network protocol (DNP).

27. The system according to claim 25, wherein said gateway encapsulates said first protocol within said second protocol.

28. The system according to claim 25, wherein said first protocol is recognized by at least one of said slave devices that unencapsulates said first protocol from said second protocol.

29. A method of interfacing a master application with a plurality of slave devices via a gateway using a nonaddressable protocol, comprising the steps of:
   building a request at said gateway responsive to a first message received from said master application;
   transmitting said request to said slave devices;
   starting a timer having a timeout period;
   checking said slave devices for a second message within said timeout period; and
   building a response at said gateway responsive to said second message and transmitting said response to said master application if one of said slave devices provides said second message within said timeout period.

30. A method of interfacing a master application with a plurality of addressable slave devices via a gateway using an addressable protocol, comprising the steps of:
   building a request having an address at said gateway responsive to a first message received from said master application;

transmitting said request to one of said slave devices, said one of said slave devices having said address;

checking said slave device at said address for a second message; and building a response at said gateway responsive to said second message and transmitting said response to said master application.

* * * * *

UNITED STATES PATENT AND TRADEMARK OFFICE
CERTIFICATE OF CORRECTION

PATENT NO. : 6,005,759

DATED : December 21, 1999

INVENTOR(S) : David G. Hart et al.

It is certified that error appears in the above-identified patent and that said Letters Patent is hereby corrected as shown below:

Col. 12, line 13, "$L_1$, $L_2$, $L_3$, and $L_4$" should read --$L_1$, $L_2$, $L_3$, and $L_4$--

Col. 12, line 48, delete "20"

Signed and Sealed this

Twenty-fourth Day of April, 2001

Attest:

NICHOLAS P. GODICI

Attesting Officer

Acting Director of the United States Patent and Trademark Office